(12) United States Patent
Kikuchi et al.

(10) Patent No.: US 6,337,803 B2
(45) Date of Patent: Jan. 8, 2002

(54) POWER MODULE

(75) Inventors: Toshio Kikuchi, Yokosuka; Shinichiro Kitada, Tokyo; Yutaro Kaneko, Yokohama, all of (JP)

(73) Assignee: Nissan Motor Co., Ltd., Yokohama (JP)

( * ) Notice: Subject to any disclaimer, the term of this patent is extended or adjusted under 35 U.S.C. 154(b) by 0 days.

(21) Appl. No.: 09/814,170

(22) Filed: Mar. 22, 2001

Related U.S. Application Data

(63) Continuation-in-part of application No. 09/559,547, filed on Jun. 23, 2000.

(30) Foreign Application Priority Data

Jun. 24, 1999 (JP) .......................................... 11-178899

(51) Int. Cl.⁷ ........................ H02M 7/537; H02M 3/335
(52) U.S. Cl. ........................................ 363/131; 363/16
(58) Field of Search .......................... 363/131, 98, 132, 363/127, 97, 80, 16, 56

(56) References Cited

U.S. PATENT DOCUMENTS

| | | | | |
|---|---|---|---|---|
| 4,099,225 A | * | 7/1978 | Nygaard | 363/56 |
| 4,413,313 A | * | 11/1983 | Robinson | 363/80 |
| 4,730,242 A | * | 3/1988 | Divan | 363/37 |
| 5,153,489 A | * | 10/1992 | Peter et al. | 318/490 |
| 5,184,057 A | * | 2/1993 | Keijiro et al. | 318/803 |
| 5,712,540 A | * | 1/1998 | Koichi et al. | 363/58 |
| 6,236,583 B1 | | 5/2001 | Kikuchi et al. | 363/132 |

* cited by examiner

Primary Examiner—Rajnikant B. Patel
(74) Attorney, Agent, or Firm—Foley & Lardner

(57) ABSTRACT

A first inverter circuit (3A) and a second inverter circuit (3B) are formed on a substrate (25). The first inverter circuit (3A) outputs a first three-phase alternating current generated by a first group of switching elements (SW1, SW2, SW3, SW4, SW5, SW6) via a first output busbar (28UA), a second output busbar (28VA), and a third output busbar (28WA). A second inverter circuit (3B) outputs a second three-phase alternating current generated by a second group of switching elements (SW7, SW8, SW9, SW10, SW11, SW12) via a fourth output busbar (28UB), a fifth output busbar (28VB), and a sixth output busbar (28WB). The fourth output busbar (28UB) is in close proximity to the first output busbar (28UA), the fifth output busbar (28VB) is in close proximity to the second output busbar (28VA) and the sixth output busbar (28WB) is in close proximity to the third output busbar (28WA). The first group of switching elements (SW1, SW2, SW3, SW4, SW5, SW6) and second group of switching elements (SW7, SW8, SW9, SW10, SW11, SW12) are arranged so that the direction of the current in the fourth output busbar (28UB) is opposite to the direction of the current in the first output busbar (28UA), the direction of the current in the fifth output busbar (28VB) is opposite to the direction of the current in the second output busbar (28VA), and the direction of the current in the sixth output busbar (28WB) is opposite to the direction of the current in the third output busbar (28WA).

3 Claims, 11 Drawing Sheets

| DIRECTION OF POWER CURRENT | | U→V↑W | U↑V→W | U↑W→V | U→W↑V | V→W↑U | V↑U→W | W↑U→V |
|---|---|---|---|---|---|---|---|---|
| ROTATION ANGLE OF ROTOR | | 0-60° | 60-120° | 120-180° | 180-240° | 240-300° | 300-360° |
| COIL A | SW1 | H | H | H | L | L | L |
| | SW2 | L | L | L | H | H | H |
| | SW3 | L | L | H | H | H | L |
| | SW4 | H | H | L | L | L | H |
| | SW5 | L | H | L | H | L | H |
| | SW6 | H | L | H | L | H | L |
| VOLTAGE AT NEUTRAL POINT | | 1/3Ed | 2/3Ed | 2/3Ed | 2/3Ed | 1/3Ed | 1/3Ed |
| COIL B | SW7 | L | L | L | H | H | H |
| | SW8 | H | H | H | L | L | L |
| | SW9 | H | H | L | L | L | H |
| | SW10 | L | L | H | H | H | L |
| | SW11 | H | L | H | L | H | L |
| | SW12 | L | H | L | H | L | H |
| VOLTAGE AT NEUTRAL POINT | | 2/3Ed | 1/3Ed | 1/3Ed | 1/3Ed | 2/3Ed | 2/3Ed |
| SUM OF VOLTAGES AT NEUTRAL POINTS | | 3/3Ed | 3/3Ed | 3/3Ed | 3/3Ed | 3/3Ed | 3/3Ed |

FIG.2

POWER MODULE

This application is a continuation-in-part of prior U.S. application Ser. No. 09/599,547, filed Jun. 23, 2000, and Japanese Application 11-178899, filed Jun. 24, 1999. The entire contents of both of these applications is incorporated herein by reference.

FIELD OF THE INVENTION

This invention relates to a power module of an inverter circuit which supplies electric power to an alternating current motor.

BACKGROUND OF THE INVENTION

A technique is known whereby a direct current is converted to an alternating current of a predetermined frequency and a predetermined voltage by an inverter in order to obtain an alternating current which drives an alternating current motor. The direct current is obtained by supplying it from battery current or by rectifying alternating current with a converter or a rectifier circuit.

SUMMARY OF THE INVENTION

When an alternating current is generated in the inverter, a magnetic field is also formed around the current flow. Such a magnetic field may adversely affect to the electronic parts in the vicinity when it becomes large.

It is therefore an object of this invention to suppress the formation of the magnetic field in the inverter.

It is another object of this invention to make an inverter circuit more compact.

It is yet another object of this invention to make the space occupied by an alternating current motor and an inverter circuit which drives the alternating current motor, smaller.

In order to achieve the above objects, this invention provides a power module for an inverter which converts a direct current from a direct current power supply source to two types of three-phase alternating current.

The power module comprises a substrate, a first inverter circuit formed on the substrate, and a second inverter circuit formed on the substrate.

The first inverter circuit comprises a first group of switching elements, a first output busbar, a second output busbar and a third output busbar, wherein the first output busbar, second output busbar and third output busbar output a first three-phase alternating current generated by the first group of switching elements.

The second inverter circuit comprises a second group of switching elements, a fourth output busbar disposed in close proximity to the first output busbar, a fifth output busbar disposed in close proximity to the second output busbar and a sixth output busbar disposed in close proximity to the third output busbar, wherein the fourth output busbar, the fifth output busbar and sixth output busbar output a second three-phase alternating current generated by the second group of switching elements.

The first group of switching elements and second group of switching elements, are disposed so that the current flowing in the fourth output busbar and the current flowing in the first output busbar are in opposite directions, and the current flowing in the fifth output busbar and the current flowing in the second output busbar are in opposite directions, and the current flowing in the sixth output busbar and the current flowing in the second output busbar are in opposite directions.

The details as well as other features and advantages of this invention are set forth in the remainder of the specification and are shown in the accompanying drawings.

BRIEF DESCRIPTION OF THE DRAWINGS

FIG. 2 is a table showing the switching state of switching elements of the power module, and the direction of the current between phase U, phase V and phase W phase coils of the alternating current motor.

DESCRIPTION OF THE PREFERRED EMBODIMENTS

Figure 1:
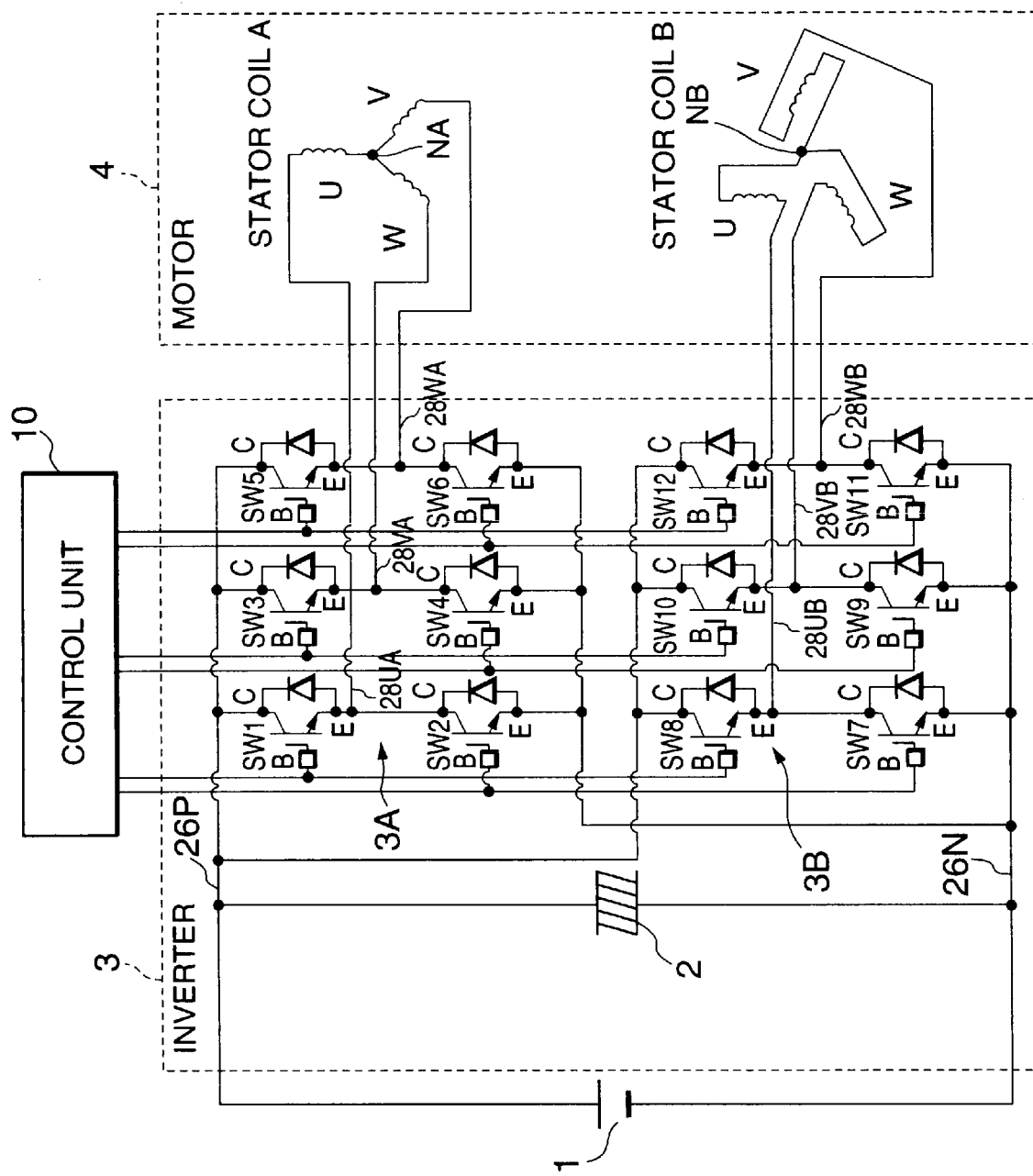
FIG. 1 is a circuit diagram of an inverter using a power module according to this invention and an alternating current motor which the inverter drives.

Referring to FIG. 1 of the drawings, a stator of a three-phase alternating current motor 4 comprises a stator coil A and stator coil B wound in parallel with phase U, phase V and phase W. The three-phase alternating current from a switching circuit 3A of an inverter 3 is supplied to the stator coil A. The three-phase alternating current from a switching circuit 3B of the inverter 3 is supplied to the stator coil B.

The switching signals S1 (S4), S2 (S5) and S3 (S6) have phase differences of a hundred and twenty degrees. As a result, the inverter circuit 3A supplies U phase current, V phase current and W phase current with phase differences of a hundred and twenty degrees to the phase U, phase V and phase W of the stator coil A. The inverter circuit B supplies U phase current, V phase current and W phase current with phase differences of a hundred and twenty degrees to the phase U, phase V and phase W of the stator coil B.

A control unit 10 outputs a square wave signal to the switching elements SW1–SW12 in sixty degree units, as shown in the table of FIG. 2. ON is represented by "H" and OFF is represented by "L." The switching elements SW1–SW2 perform ON/OFF switching operations according to this signal. In the following description, this section divided every sixty degrees is called a switching period.

For the phase U, the control unit 10 outputs the same signal S1 to switching elements SW1, SW8.

A signal S4 having a phase difference of a hundred and eighty degrees from the signal S1 to the switching elements SW1, SW8 is output to the switching elements SW2, SW7. For the phase W, the control unit 10 outputs the same signal S2 to the switching elements SW3, SW10.

A signal S5 having a phase difference of a hundred and eighty degrees from the signal S2 to the switching elements SW3, SW10 is output to the switching elements SW4, SW9. For the phase V, the control unit 10 outputs the same signal S3 to the switching elements SW5, SW12.

A signal S6 having a phase difference of a hundred and eighty degrees from the signal S3 to the switching elements SW5, SW12 is output to the switching elements SW6, SW11.

As a result of the above signal outputs, currents having a phase difference of sixty degrees to each other flow from the switching circuit 3A to the phase U, phase V and phase W of the stator coil A. Also, currents respectively having opposite phase to the currents flowing from the switching circuit 3A to the stator coil A flow from the switching circuit 3B to the phase U, phase V and phase W of the stator coil B.

Figure 3:
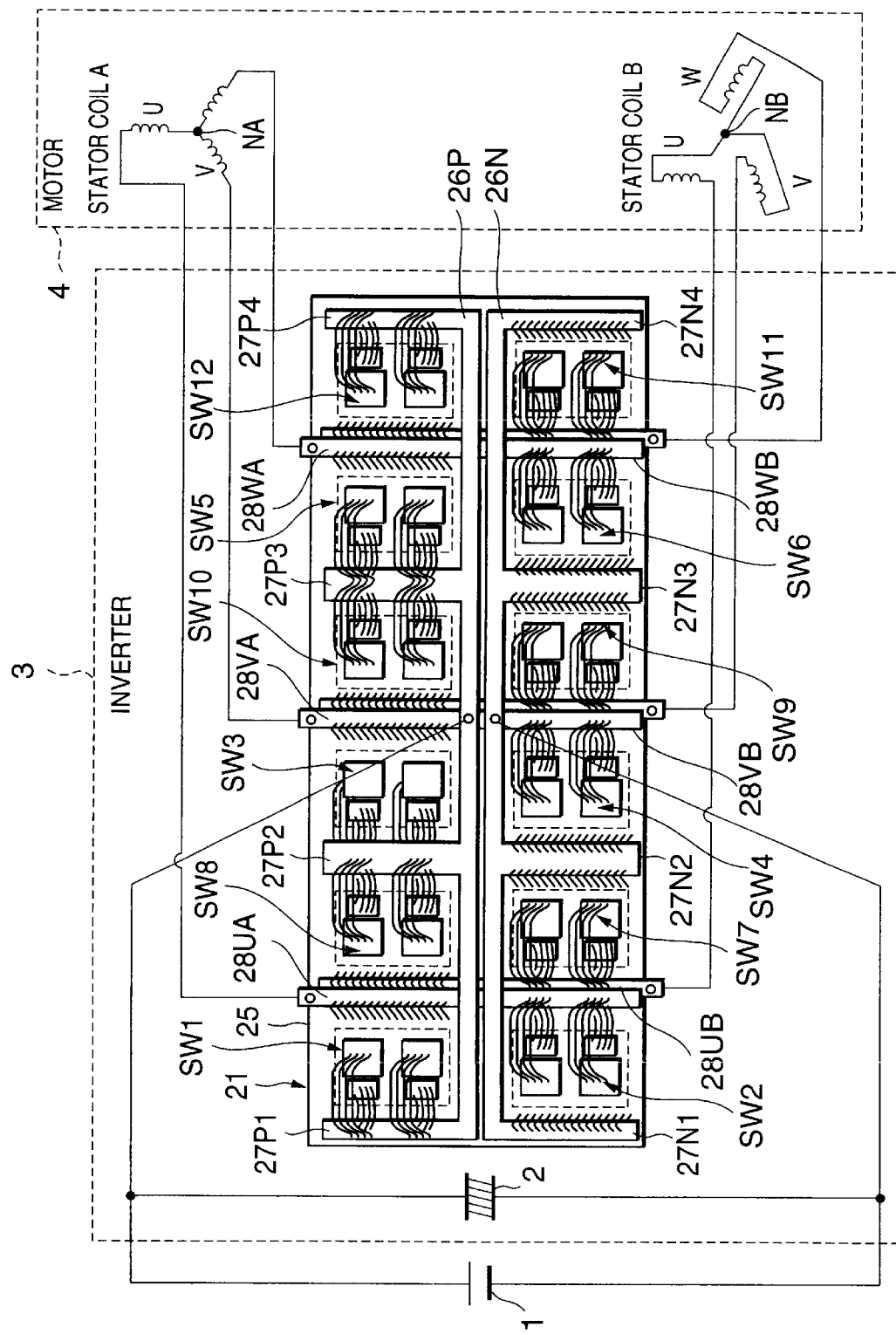
FIG. 3 is a circuit diagram of the inverter comprising a plan view of the power module.

In order to realize the above circuit configuration of the inverter 3, the inverter 3 comprises a power module 21 in which the switching elements SW1–SW6 and switching elements SW7–SW12 are installed on one substrate 25 as shown in FIG. 3.

The power module 21 has the following construction.

At a center part of the substrate 25, a positive electrode busbar 26P and a negative electrode busbar 26N are disposed in proximity and parallel with each other.

Positive electrode busbar branches 27P1, 27P2, 27P3, 27P4 extending in a perpendicular direction, are formed in the positive electrode busbar 26P. The switching elements SW1 and SW8 are arranged between the positive electrode busbar branches 27P1 and 27P2. The switching elements SW3 and SW10 are arranged between the positive electrode busbar branches 27P2 and 27P3. The switching elements SW5 and SW12 are arranged between the positive electrode busbar branches 27P3 and 27P4.

A collector C of the switching element SW1 shown in FIG. 1 is connected to the positive electrode busbar branch 27P1. Collectors C of the switching element SW8 and the switching element SW3 shown in FIG. 1 are connected to the positive electrode busbar branch 27P2, respectively. Collectors C of the switching elements SW10 and SW5 shown in FIG. 1 are connected to the positive electrode busbar branch 27P3, respectively. The collector C of the switching element SW12 shown in FIG. 1 is connected to the positive electrode busbar branch 27P4.

Negative electrode busbar branches 27N1, 27N2, 27N3, 27N4 are formed extending in a perpendicular direction in the negative electrode busbar 26N. The negative electrode busbar branches 27N1, 27N2, 27N3, 27N4 project from the negative electrode busbar 26N in opposite directions to the positive electrode busbar branches 27P1, 27P2, 27P3 and 27P4, respectively.

SW2 and SW7 are disposed between the negative electrode busbar branches 27N1 and 27N2. The switching elements SW4 and SW9 are disposed between the negative electrode busbar branches 27N2 and 27N3. The switching elements SW6 and SW11 are disposed between the negative electrode busbar branches 27N3 and 27N4.

The collector C of the switching element SW2 shown in FIG. 1 is connected to the negative electrode busbar branch 27N1. The collectors C of the switching elements SW7 and SW4 shown in FIG. 1 are respectively connected to the negative electrode busbar branch 27N2. The collectors C of the switching elements SW9 and SW6 shown in FIG. 1 are respectively connected to the negative electrode busbar branch 27N3. The collector C of the switching element SW11 shown in FIG. 1 is connected to the negative electrode busbar branch 27N4.

Further, output bus bars 28UA, 28VA, 28WA are arranged perpendicular to the positive electrode busbar 26P and negative electrode busbar 26N, and supply a current to the phase U, phase V and phase W of the stator coil A in the state where they are insulated from the positive electrode busbar 26P and negative electrode busbar 26N. The output busbar 28UA is arranged between the switching elements SW1, SW2, and switching elements SW8, SW7. The output busbar 28VA is arranged between the switching elements SW3, SW4, and switching elements SW10, SW9. The output busbar 28WA is arranged between the switching elements SW5, SW6, and switching elements SW12, SW11.

An emitter E of the switching element SW1 and the collector C of the switching element SW2 shown in FIG. 1 are connected to the output busbar 28UA. An emitter E of the switching element SW3 and the collector C of the switching element SW4 shown in FIG. 1 are connected to the output busbar 28VA. An emitter E of the switching element SW5 and the collector C of the switching element SW6 shown in FIG. 1 are connected to the output busbar 28WA.

The output bus bars 28UB, 28VB, 28WB which supply current to the phase U, phase V and phase W of coil B are disposed respectively parallel and in close proximity to the output bus bars 28UA, 28VA, 28WA. The output bus bars 28UB, 28VB, 28WB are also arranged in a state of insulation with respect to all of the positive electrode busbar 26P, negative electrode busbar 26N and output bus bars 28UB, 28VB, and 28WB.

In FIG. 3 of the drawings, the output bus bars 28UA, 28VA, 28WA and the output bus bars 28UB, 28VB, 28WB are drawn staggered to the left and right for convenience of description, but the output bus bars 28UA, 28VA, 28WA, and output bus bars 28UB, 28VB, 28WB, actually overlap.

An emitter E of the switching element SW8 and the collector of the switching element SW7 shown in FIG. 1 are connected to the output busbar 28UB. An emitter E of the switching element SW10 and the collector C of the switching element SW9 shown in FIG. 1 are connected to the output busbar 28VB. An emitter E of the switching element SW12 and the collector C of the switching element SW11 shown in FIG. 1 are connected to the output busbar 28WB.

A drive signal is output from the control unit 10 to the pair of switching elements SW1 and SW8 which synchronously perform ON/OFF operation, the pair of switching elements SW2 and SW7, the pair of switching elements SW3 and SW10, the pair of switching elements SW4 and SW9, the pair of switching elements SW5 and SW12, and the pair of switching elements SW6 and SW11, respectively. For this purpose, a base B of the switching element of each pair shown in FIG. 1 is connected to the control unit 10 by a common bus.

The positive electrode busbar 26P is connected with the battery 1 shown in FIG. 1, which is a direct current power supply source, and with the positive electrodes of the electrolytic capacitor 2. The negative electrode busbar 26N is connected with the battery 1 and the negative electrodes of the electrolytic capacitor 2.

Referring to FIG. 3, an upper end of the output busbar 28UA is connected to the phase U of the coil A of the alternating current motor 4. An upper end of the output busbar 28VA is connected to the phase V of the coil A of the alternating current motor 4. An upper end of the output busbar 28WA is connected to the phase W of the coil A of the alternating current motor 4. The output bus bars 28UA, 28VA, 28WA therefore correspond to three-phase alternating current output terminals of the switching circuit 3A.

Likewise, a lower end of the output busbar 28UB is connected to the phase U of the coil B of the alternating current motor 4. An lower end of the output busbar 28VB is connected to the phase V of the coil B of the alternating current motor 4. An lower end of the output busbar 28WB is connected to the phase W of the coil B of the alternating current motor 4. The output bus bars 28UB, 28VB, 28WB therefore correspond to three-phase alternating current output terminals of the switching circuit 3B.

Thus, the inverter 3 can be made compact by storing all of the switching elements on one substrate 25.

Moreover, as the positive electrode busbar 26P and negative electrode busbar 26N are arranged in parallel, and the output busbar 28UA, 28VA, 28WA, and output busbar 28UB, 28VB, 28WB are respectively arranged parallel, the magnetic fields produced around the bus bars by the currents are mutually negated.

The interaction of this field will be described with reference to FIGS. 4–9.

Figure 4:
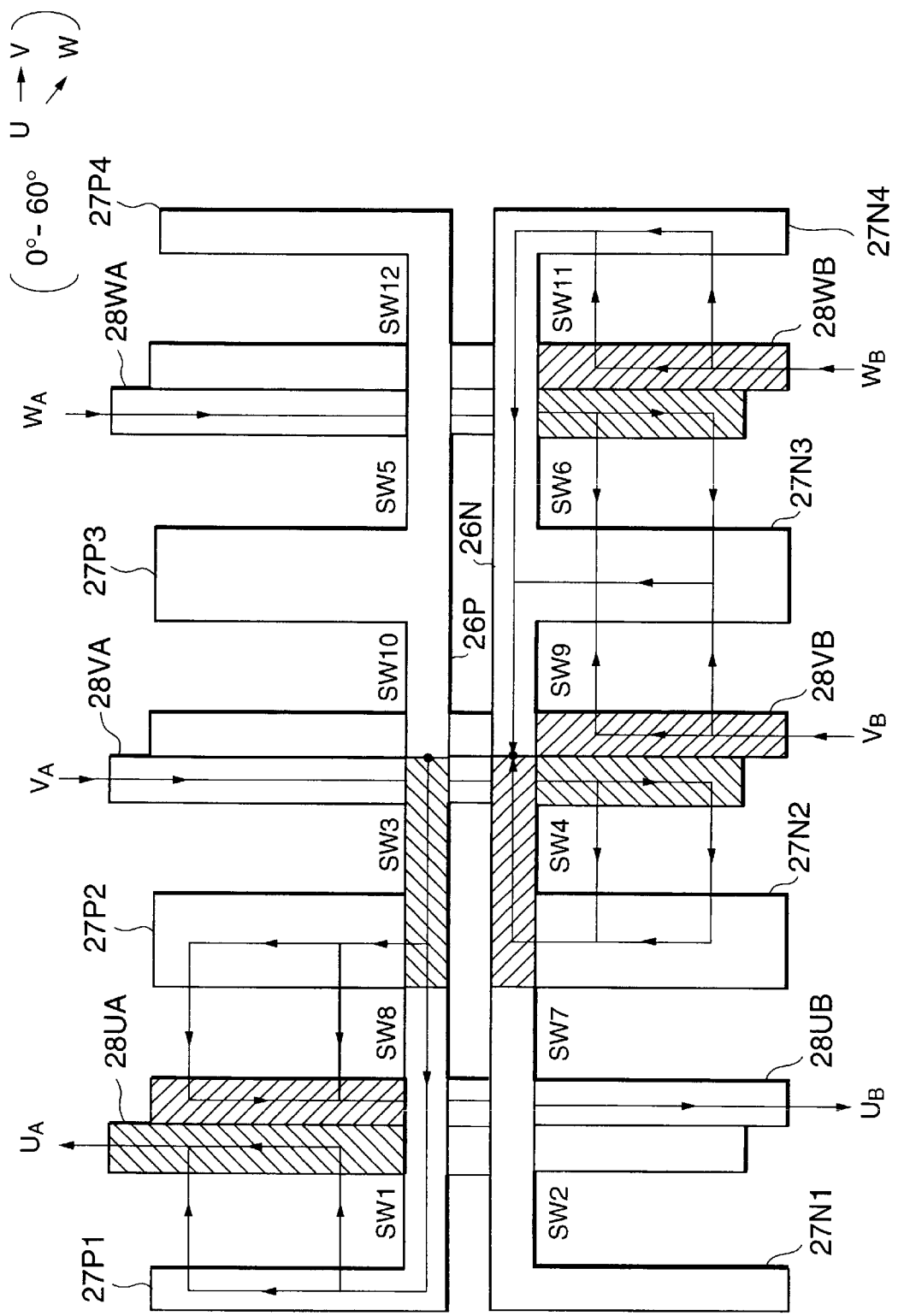
FIG. 4 is a diagram describing the current flow within the power module in a switching period of 0 to 60 degrees.
Figure 5:
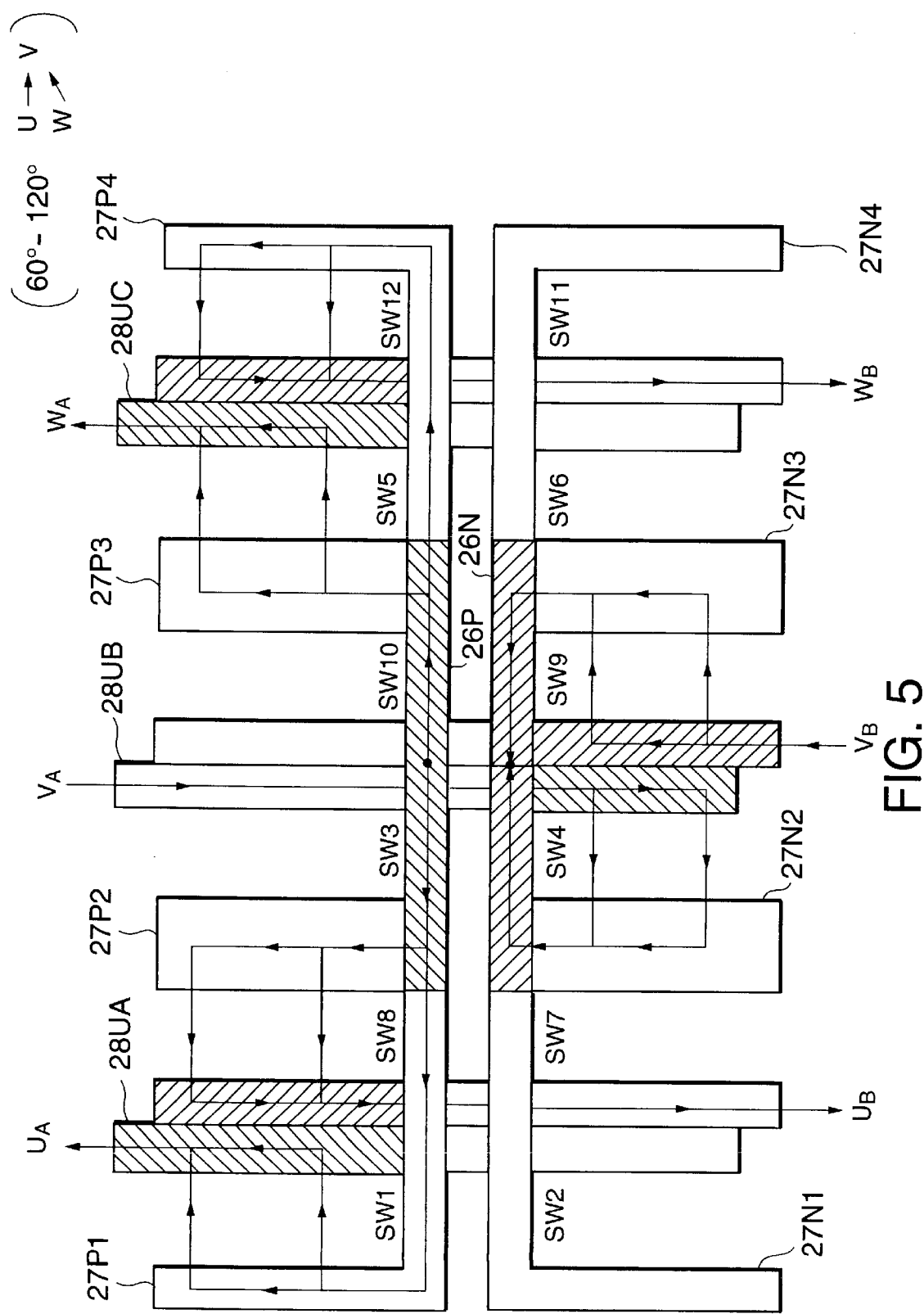
FIG. 5 is a diagram describing the current flow within the power module in a switching period of 60–120 degrees.
Figure 6:
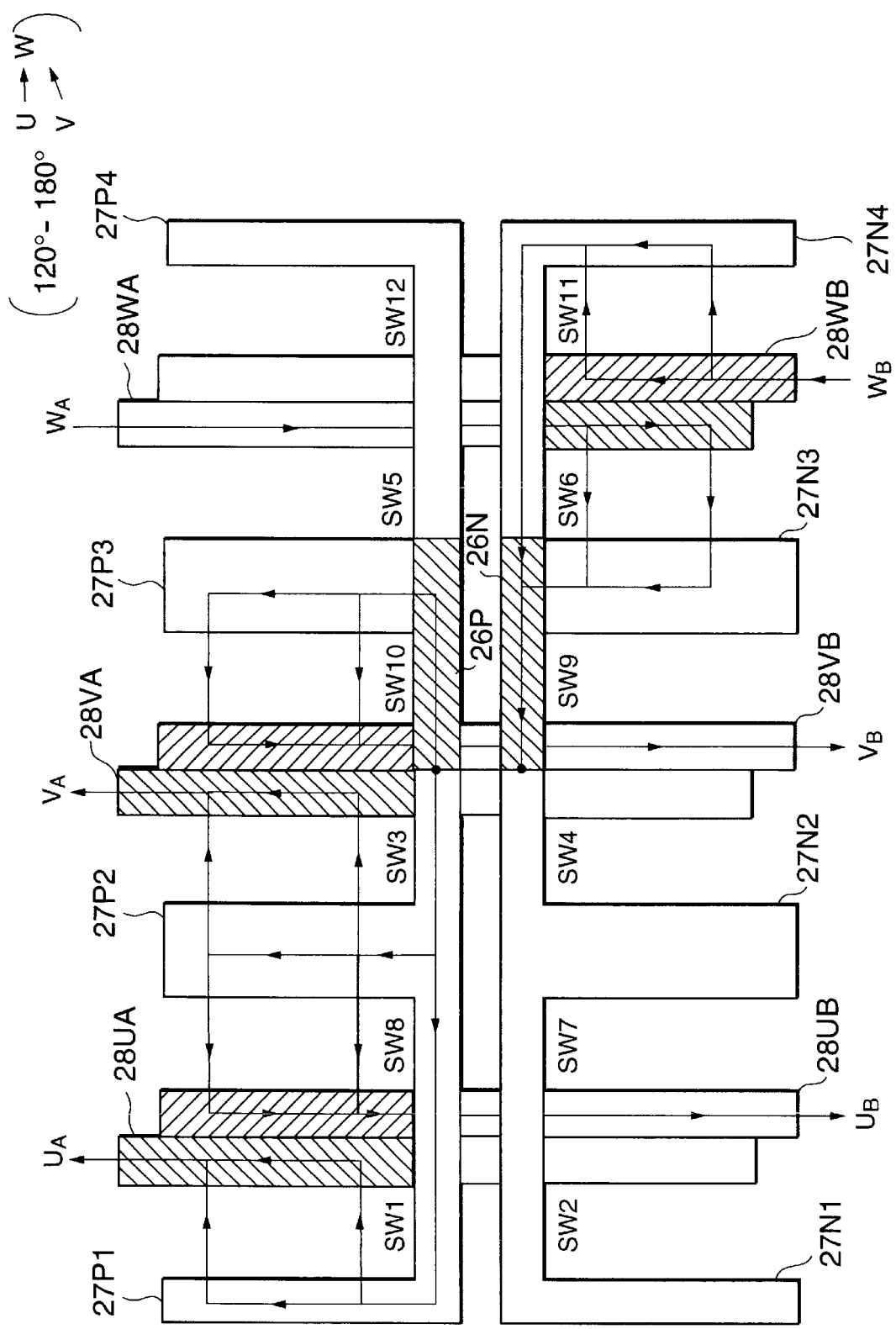
FIG. 6 is a diagram describing the current flow within the power module in a switching period of 120–180 degrees.
Figure 7:
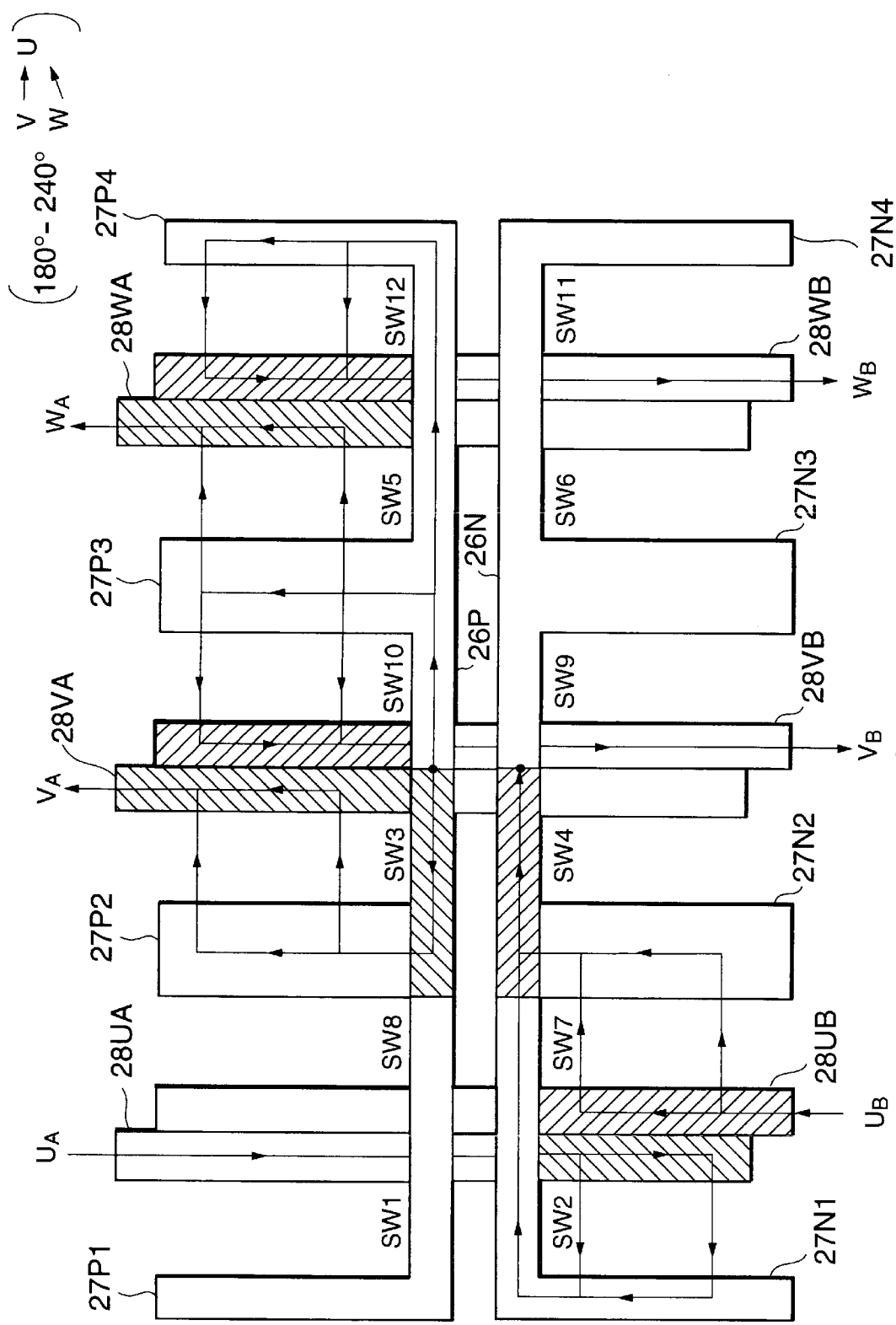
FIG. 7 is a diagram describing the current flow within the power module in a switching period of 180–240 degrees.
Figure 8:
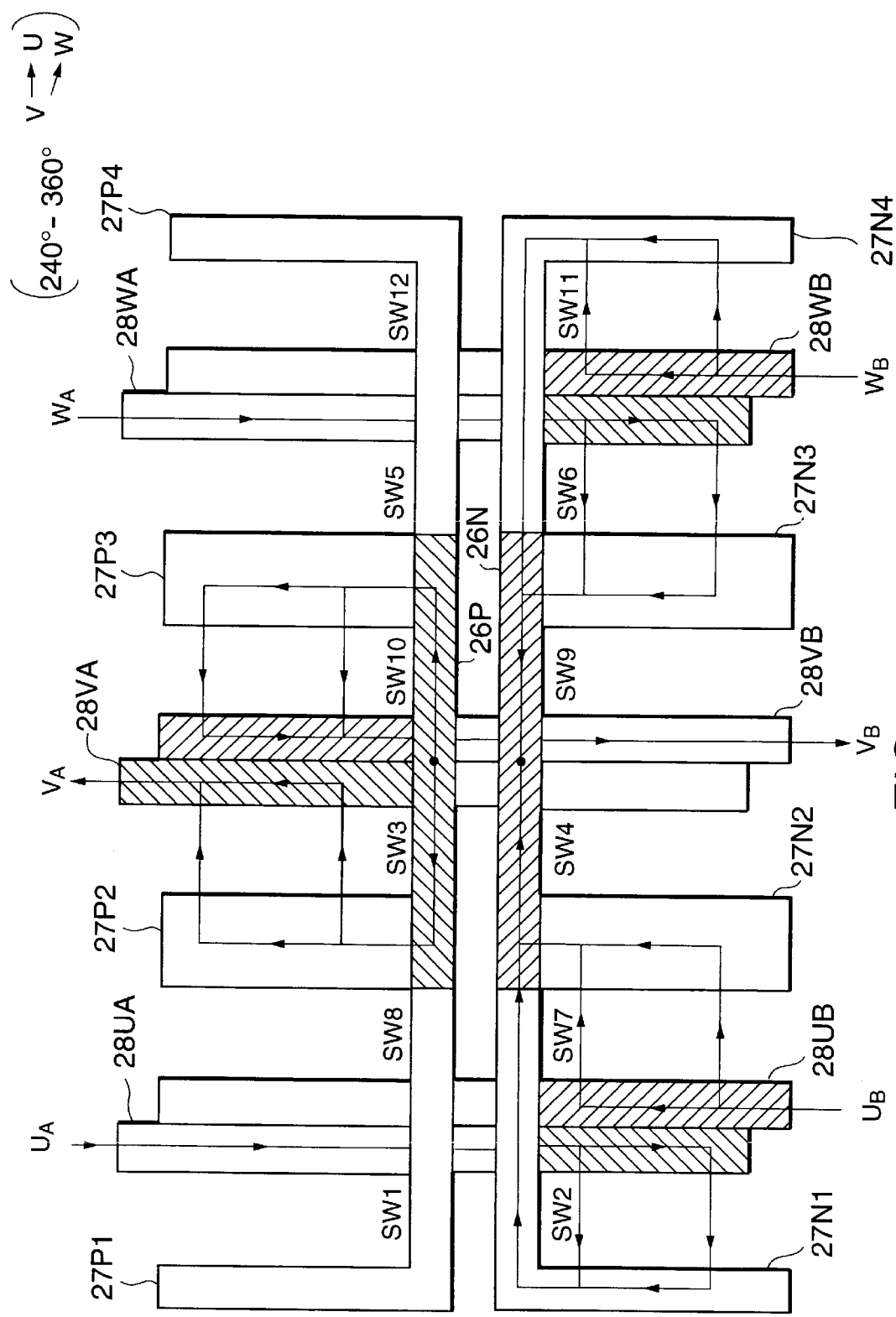
FIG. 8 is a diagram describing the current flow within the power module in a switching period of 240–300 degrees.
Figure 9:
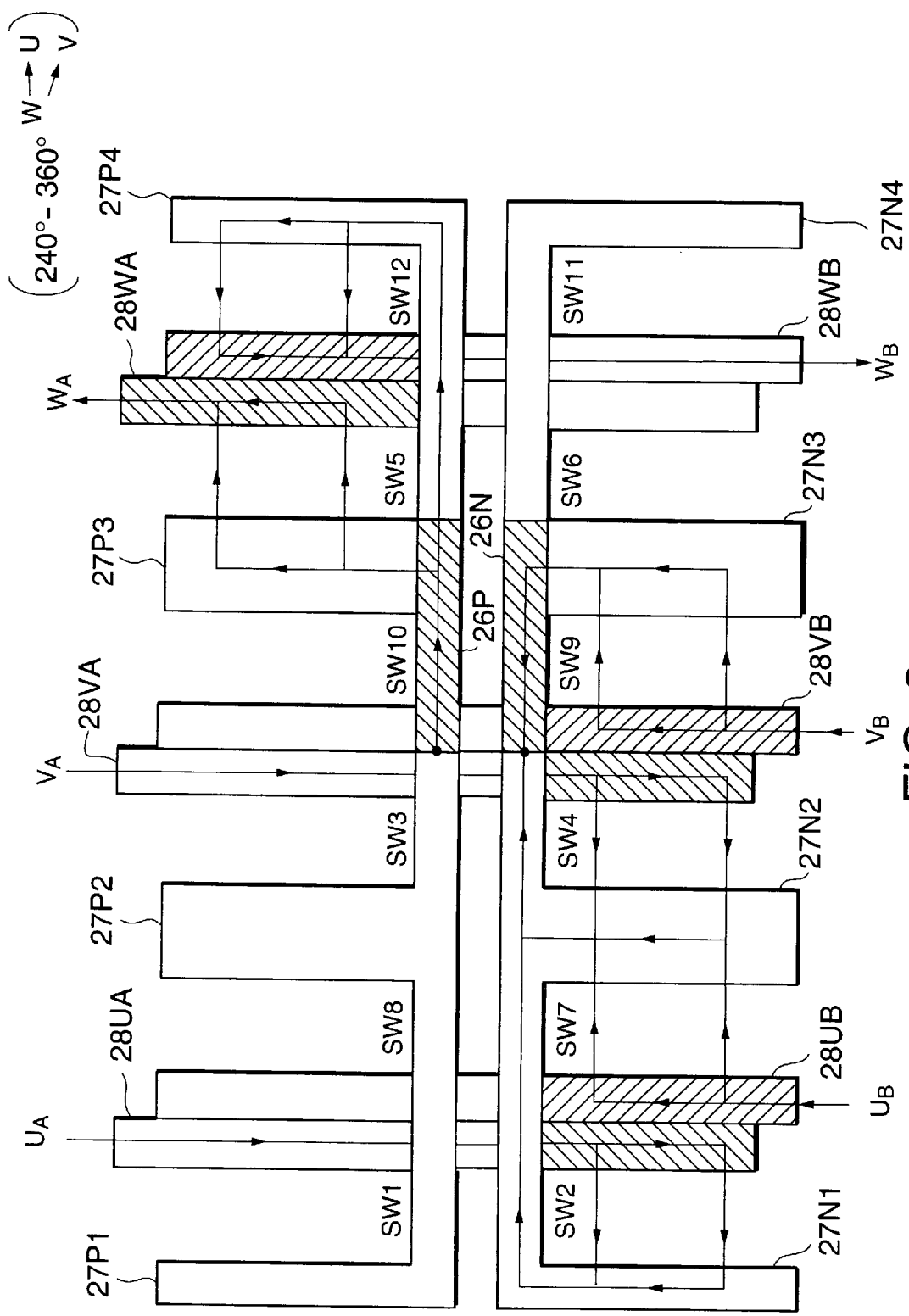
FIG. 9 is a diagram describing the current flow within the power module in a switching period of 300–360 degrees.

FIG. 4 shows the current flow in the switching period 0–60 degrees shown in the table of FIG. 2.

In the switching period 0–60 degrees, a current flow is set up toward the phase V from the phase W and the phase U, and in the power module 21, current is output from the output bus bars 28UA, 28UB, 28WA, 28WB and input into the output bus bars 28VA, 28VB. Consequently, the direction of the current is reversed in part of the output busbar 28UA and part of the adjoining output busbar 28UB, and in this part, the fields due to the current are mutually canceled out. The same is true of a part of the output busbar 28VA and a part of the adjoining output busbar 28VB. The same is true of a part of the output busbar 28WA and a part of the adjoining output busbar 28WB.

Further, there is no section where current flows in the same direction between adjoining output bus bars. Therefore, the currents which flow in the output bus bars do not form a strong field.

In part of the positive electrode busbar 26P and part of the negative electrode busbar 26N, currents are formed in opposite directions as shown by hatching in the figure. In this part, the fields formed by the current are mutually canceled out. In other parts also, there is no section where current flows in the same direction. Therefore, the currents which flow through the positive electrode busbar 26P and negative electrode busbar 26N do not form a strong field.

Likewise, FIGS. 5–9 show the current flow through the power module 21 at 60–90 degrees, 90–120 degrees, 120–180 degrees, 180–240 degrees, 240–300 degrees, and 300–360 degrees of the switching period. As is clear from these figures, in every switching period, currents flow in opposite directions in all adjoining output bus bars, and there is no section in which current flows in the same direction. Moreover, currents always flow in opposite directions in part of the positive electrode busbar 26P and negative electrode busbar 26N, and here too there is no section in which currents flow in the same direction.

As described above, according to the inverter 3 using this power module 21, as the current in the power module 21 does not form a strong field, undesirable effects of the field on surrounding electronic parts are prevented.

Next, a second embodiment of this invention will be described referring to FIGS. 10–12.

This embodiment relates to the fixing of the inverter 3 using the power module 21 shown in FIGS. 1–3 to the alternating current motor 4.

The circuit configuration of the inverter 3, power module 21 and alternating current motor 4 are the same as those of the first embodiment. The power module 21 is disposed at the bottom of a case 31 of the inverter 3. Horizontally extending parts 29UA, 29VA, 29WA are joined to the output bus bars 28UA, 28VA, 28WA of the power module 21, respectively. Likewise, horizontally extending parts 29UB, 29VB, 29WB are joined to the output bus bars 28UB, 28VB, 28WB of the power module 21, respectively. The length of the power module 21 including the extended parts 29UA, 29VA, 29WA and the extended parts 29UB, 29VB, 29WB is set longer than the length of a case 41 of the alternating current motor 4 in the same direction. Also, the dimensions of the case 31 in the direction of an axis of rotation 43 is set to a length which can accommodate the extended parts 29UA, 29VA, 29WA, and the extended parts 29UB, 29VB, 29WB.

Figure 10:
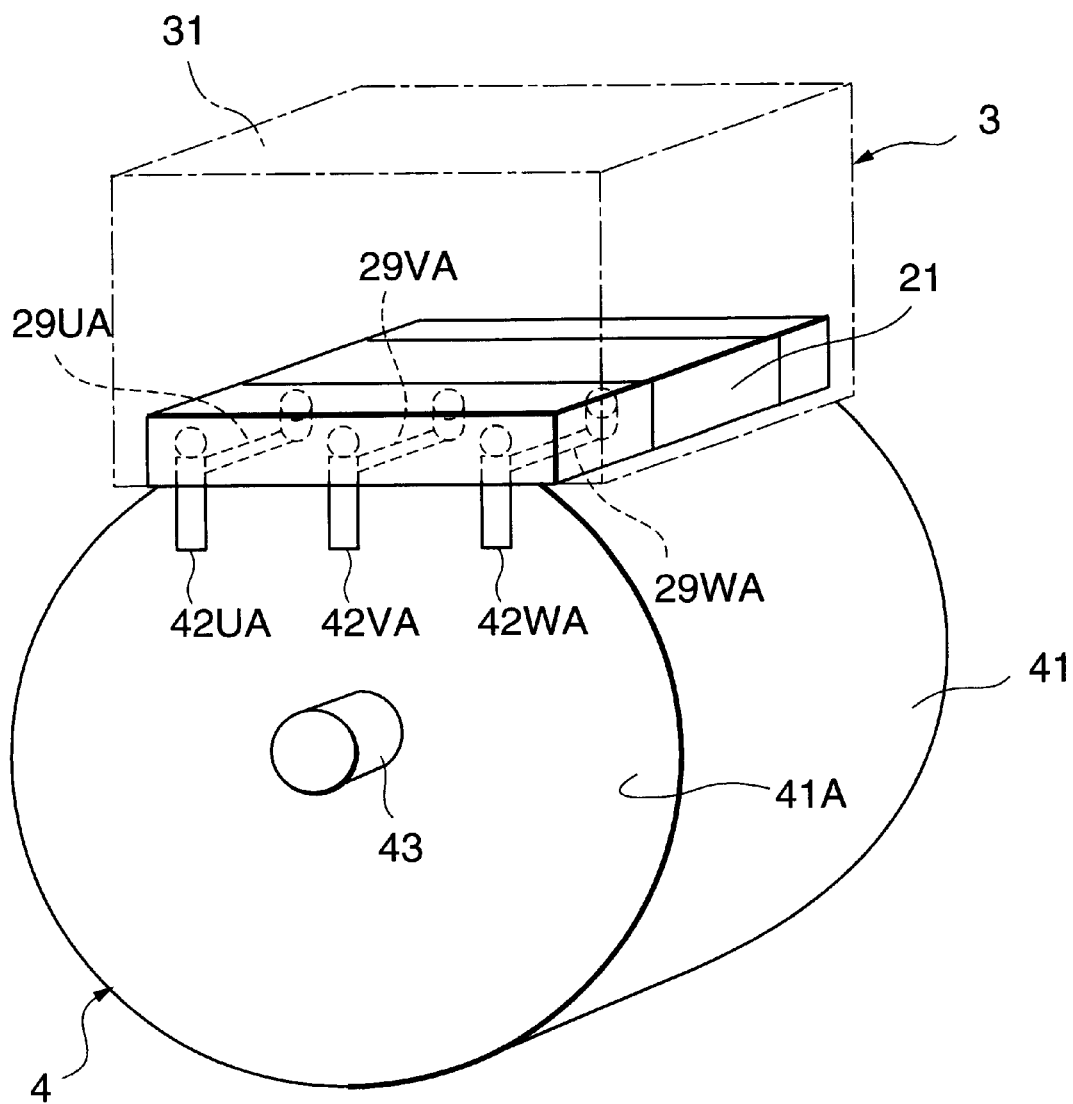
FIG. 10 is a perspective view of a power module and an alternating current motor connected to the power module according to a second embodiment of this invention.
Figure 11:
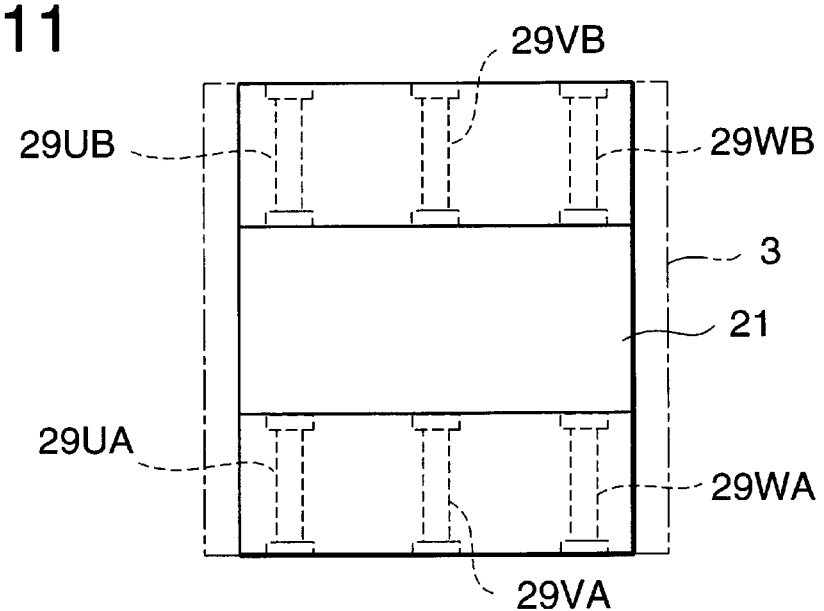
FIG. 11 is a plan view of the power module and of extended parts according to the second embodiment of this invention.

Referring to FIG. 10, external terminals 42UA, 42VA, 42WA connected to the phase U, phase V, and phase W of the stator coil A of FIG. 1 are attached to a front face 41A of the case 41 of the alternating current motor 4 so that they project above the case 41.

Figure 12:
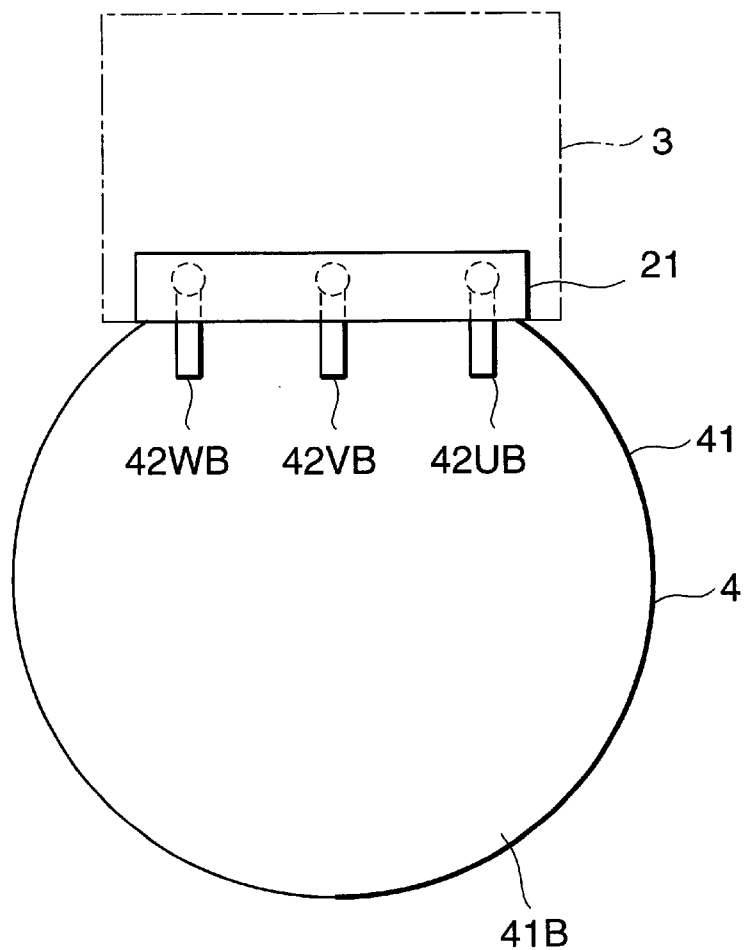
FIG. 12 is a rear view of the power module and the alternating current motor according to the second embodiment of this invention.

Referring to FIG. 12, external terminals 42UB, 42VB, 42WB connected to the phase U, phase V and phase W of the stator coil B are attached to the rear face 41B of the case 41 of the alternating current motor 4 so that they project above the case 41.

Holes through which these external terminals 42UA, 42VA, 42WA, and the external terminals 42UB, 42VB, 42WB penetrate are formed beforehand in the base of the case 31 of the inverter 3. By fitting the case 31 at a predetermined position on the case 41, the external terminals 42UA, 42VA, 42WA, and the external terminals 42UB, 42VB, 42WB respectively penetrate the case 31 and are joined to the ends of the extended parts 29UA, 29VA, 29WA, and the extended parts 29UB, 29VB, 29WB, respectively. Various methods may be used to effect the join of the external terminals to the extended parts, such as pressure clamping, welding, screwing and clamping.

The external wiring connected to the alternating current motor and power module 21 generates fields which do not cancel each other out mutually. By providing the extending parts 29UA, 29VA, 29WA and the extending parts 29UB, 29VB, 29WB which match the external terminals 42UA, 42VA, 42WA and the external terminals 42UB, 42VB, 42WB in the power module 21, as in this embodiment, the length of external wiring which connects the alternating current motor 4 to the power module 21 can be shortened. Shortening of external wiring has a desirable effect in suppressing generation of magnetic fields. Moreover, since the alternating current motor 4 and inverter 3 form one piece by the above arrangement of the power module 21, space required for installation of the inverter 3 and the alternating current motor 4 can also be saved.

The contents of Tokugan Hei 11-178899, with a filing date of Jun. 24, 1999 in Japan, are hereby incorporated by reference.

Although the invention has been described above by reference to certain embodiments of the invention, the invention is not limited to the embodiments described above. Modifications and variations of the embodiments described above will occur to those skilled in the art, in light of the above teachings.

The embodiments of this invention in which an exclusive property or privilege is claimed are defined as follows:

What is claimed is:

1. A power module for an inverter which supplies three-phase alternating current to a three-phase alternating current motor provided with two first phase stator coils, two second phase stator coils, and two third phase stator coils, comprising:

a substrate;

a first inverter circuit formed on the substrate, the first inverter circuit comprising a first output bus bar which outputs a first current to one of the first stator coils, a second output bus bar which outputs a second current to one of the second stator coils, and a third output bus bar which outputs a third current to one of the third stator coils; and a second inverter circuit formed on the substrate, the second inverter circuit comprising a fourth output bus bar which outputs the first current to the other of the first stator coils, a fifth output bus bar which outputs the second current to the other of the second stator coils, and a sixth output bus bar which outputs the third current to the other of the third stator coils;

wherein the first output bus bar and the fourth output bus bar are arranged in parallel with each other while a direction of the first current in the first output bus bar and a direction of the first current in the fourth output bus bar are opposite to each other, the second output bus bar and the fifth output bus bar are arranged in parallel with each other while a direction of the second curent in the second output bus bar and a direction of the second current in the fifth output bus bar are opposite to each other, and the third output bus bar and the sixth output bus bar are arranged in parallel with each other while a direction of the third current in the third output bus bar and a direction of the third current in the sixth output bus bar are opposite to each other.

2. The power module as defined in claim 1, wherein the first inverter circuit and the second inverter circuit are connected to a direct current power supply source provided with a positive electrode and a negative electrode, the first inverter circuit comprises a first switching element interposed between the positive electrode and the first output bus bar, a second switching element interposed between the negative electrode and the first output bus bar, a third switching element interposed between the positive electrode and the second output bus bar, a fourth switching element interposed between the negative electrode and the second output bus bar, a fifth switching element interposed between the positive electrode and the third output bus bar and a sixth switching element interposed between the negative electrode and the third output bus bar, the second inverter circuit comprises a seventh switching element interposed between the positive electrode and the fourth output bus bar, an eighth switching element interposed between the negative electrode and the fourth output bus bar, a ninth switching element interposed between the positive electrode and the fifth output bus bar, a tenth switching element interposed between the negative electrode and the fifth output bus bar, an eleventh switching element interposed between the positive electrode and the sixth output bus bar and a twelfth switching element interposed between the negative electrode and the sixth output bus bar, an end of the first output bus bar is connected to one of the first stator coils while an end of the fourth output bus bar is connected to the other of the first stator coils, the end of the first output bus bar and the end of the fourth output bus bar directing in opposite directions, an end of the second output bus bar is connected to one of the second stator coils while an end of the fifth output bus bar is connected to the other of the second stator coils, the end of the second output bus bar and the end of the fifth output bus bar directing in opposite directions, and an end of the third output bus bar is connected to one of the third stator coils while an end of the sixth output bus bar is connected to the other of the third stator coils, the end of the third output bus bar and the end of the sixth output bus bar directing opposite directions, the first switching element and the eighth switching element is driven by a first switching signal current, the third switching element and the tenth switching element are driven by a second switching signal current, the fifth switching element and the twelfth switching element are driven by a third switching signal current, the second switching element and the seventh switching element are driven by a fourth switching signal current which has an opposite phase to the first switching signal current, the fourth switching element and the ninth switching element are driven by a fifth switching signal current which has an opposite phase to the second switching signal current, and the sixth switching element and the eleventh switching element are driven by a sixth switching signal current which has an opposite phase to the third switching signal current.

3. A power module as defined in claim 1, wherein the power module comprises extension parts horizontally extending respectively from the output bus bars so as to connect external terminals of the alternating current motor to the first output busbar, second output busbar, third output busbar, fourth output busbar, fifth output busbar and sixth output busbar.

* * * * *